(12) United States Patent
Akiyama

(10) Patent No.: US 9,219,347 B2
(45) Date of Patent: Dec. 22, 2015

(54) OPTICAL SEMICONDUCTOR DEVICE

(71) Applicant: FUJITSU LIMITED, Kawasaki-shi, Kanagawa (JP)

(72) Inventor: Tomoyuki Akiyama, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/156,594

(22) Filed: Jan. 16, 2014

(65) Prior Publication Data

US 2014/0133512 A1    May 15, 2014

Related U.S. Application Data

(63) Continuation of application No. PCT/JP2011/070491, filed on Sep. 8, 2011.

(51) Int. Cl.
| | |
|---|---|
| *H01S 5/00* | (2006.01) |
| *H01S 5/10* | (2006.01) |
| *H01S 5/14* | (2006.01) |
| *B82Y 20/00* | (2011.01) |
| *H01S 5/02* | (2006.01) |
| *H01S 5/343* | (2006.01) |
| *H01S 5/40* | (2006.01) |
| *G02B 6/293* | (2006.01) |

(52) U.S. Cl.
CPC ............ *H01S 5/1071* (2013.01); *B82Y 20/00* (2013.01); *H01S 5/141* (2013.01); *G02B 6/29343* (2013.01); *H01S 5/0215* (2013.01); *H01S 5/3434* (2013.01); *H01S 5/4025* (2013.01)

(58) Field of Classification Search
CPC ....... H01S 5/125; H01S 5/1007; H01S 5/141; H01S 5/068
USPC .................................................. 372/50.11, 94
See application file for complete search history.

(56) References Cited

U.S. PATENT DOCUMENTS

| | | | | |
|---|---|---|---|---|
| 7,843,986 B2* | 11/2010 | Yamazaki | ........................ | 372/94 |
| 2004/0136412 A1* | 7/2004 | Jones | .............................. | 372/20 |

(Continued)

FOREIGN PATENT DOCUMENTS

| | | |
|---|---|---|
| CN | 1675807 A | 9/2005 |
| CN | 1889313 A | 1/2007 |

(Continued)

OTHER PUBLICATIONS

Hsu-Hao Chang et al., "Integrated hybrid silicon triplexer", Optics Express, vol. 18, No. 23, pp. 23891-23899, Nov. 8, 2010.

(Continued)

*Primary Examiner* — Tuan Nguyen
(74) *Attorney, Agent, or Firm* — Fujitsu Patent Center

(57) ABSTRACT

An optical semiconductor device includes a ring laser including a ring resonator in which an optical gain element having an optical gain by current injection is provided, a waveguide optically coupled to the ring laser, and a reflector provided at an end portion of the waveguide and configured to reverse the advancing direction of light outputted from the ring laser and propagating in the waveguide.

14 Claims, 11 Drawing Sheets

(56) References Cited

U.S. PATENT DOCUMENTS

| | | | |
|---|---|---|---|
| 2006/0153268 A1 | 7/2006 | Yu | |
| 2009/0122817 A1* | 5/2009 | Sato et al. | 372/20 |
| 2010/0246612 A1* | 9/2010 | Shimizu | 372/18 |
| 2010/0257950 A1* | 10/2010 | Yang | 74/5.6 A |
| 2010/0316074 A1* | 12/2010 | Fukuda | 372/43.01 |
| 2011/0013654 A1 | 1/2011 | Yamazaki | |
| 2011/0243501 A1 | 10/2011 | Mandorlo et al. | |
| 2013/0016744 A1* | 1/2013 | Li et al. | 372/20 |

FOREIGN PATENT DOCUMENTS

| | | |
|---|---|---|
| JP | 2008-197058 | 8/2008 |
| WO | 95/07562 | 3/1995 |
| WO | 2009/119284 A1 | 10/2009 |
| WO | 2010004015 A1 | 1/2010 |

OTHER PUBLICATIONS

Alphan Sennaroglu et al., "Unidirectional Operation of Rectangular Dielectric Single-Mode Ring Waveguide Lasers", Journal of Lightwave Technology, vol. 9, No. 9, pp. 1094-1098, Sep. 1991.

International Search Report, mailed in connection with PCT/JP2011/070491 and mailed Oct. 25, 2011.

Cho, S.H. et al,; "Unidirectionality of Semiconductor Ring Lasers: Theory and Experiment"; Semiconductor Laser Conference 2002 IEEE 18th International; 2002; pp. 69-70; IEEE.

Jiangbo Zhu, et al.; "The Theoretical and Numerical Models of the Novel and Fast Tunable Semiconductor Ring Laser", Communications and Photonics Conference and Exhibition (ACP), 2010 Asia, 2010; pp. 726-727; IEEE.

JPOA—Office Action of Japanese Patent Application No. 2013-532367 dated Feb. 10, 2015, with relevant translation of the O.A.

CNOA—Office Action of Chinese Patent Application No. 201180072959.0 dated May 15, 2015, with English translation.

* cited by examiner

OPTICAL SEMICONDUCTOR DEVICE

CROSS-REFERENCE TO RELATED APPLICATION

This application is a continuation application of International Application PCT/JP2011/070491, filed on Sep. 8, 2011 and designated the U.S., the entire contents of which are incorporated herein by reference.

FIELD

The embodiments discussed herein are related to an optical semiconductor device.

BACKGROUND

Since a semiconductor laser which employs a ring resonator does not use a chip end face as a resonator, it is advantageous in that it is easy to apply the same to an optical integrated circuit and besides the resonance wavelength distance is so long that a single wavelength light source can be implemented readily.

Particularly in recent years, since integration with an electric circuit is easy, an optical integrated circuit on silicon is significant and, among such optical integrated circuits, a ring laser is a particularly reliable candidate as a light source.

SUMMARY

According to an aspect of the embodiment, an optical semiconductor device includes a ring laser including a ring resonator in which an optical gain element having an optical gain by current injection is provided, a waveguide optically coupled to the ring laser, and a reflector provided at an end portion of the waveguide.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Incidentally, a laser which employs a ring resonator can generally oscillate in both of a clockwise (CW) mode and a counterclockwise (CCW) mode. Therefore, in the ring laser that does not include a function for providing a mode selection performance, oscillation occurs in both of the CW mode and the CCW mode. At this time, CW mode light and CCW mode light are outputted from ports different from each other, and therefore, power per one port decreases to one half. It seems a possible idea to provide a function for providing a mode selection performance in order to increase the output power. However, in this case, the device size increases and the power consumption sometimes increases.

Therefore, in the optical semiconductor device including a light emitting element for which a ring resonator is employed, it is desired to increase the output power without increasing the device size and the power consumption.

First Embodiment

An optical semiconductor device according to a first embodiment is described with reference to FIGS. 1 to 10.

Figure 1:
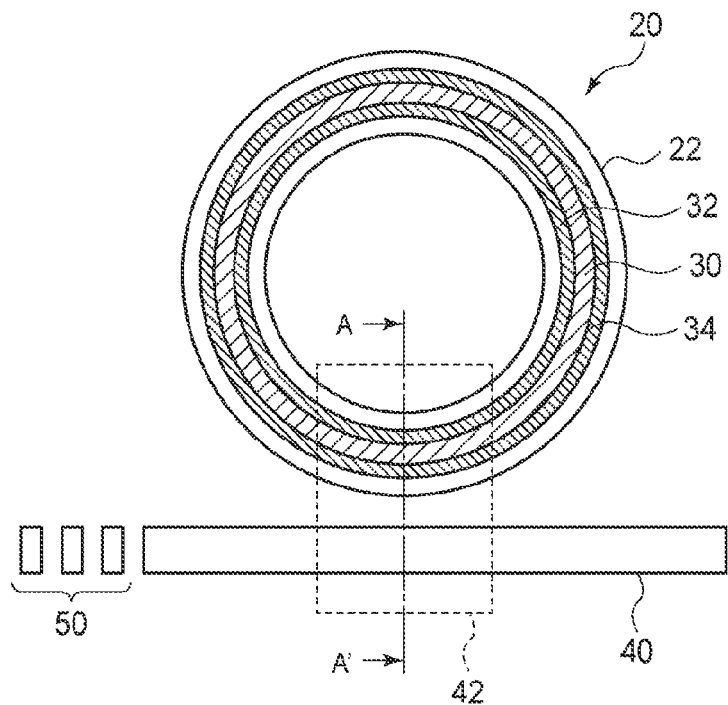
FIG. 1 is a top plan view depicting a structure of an optical semiconductor device according to a first embodiment.
Figure 2:
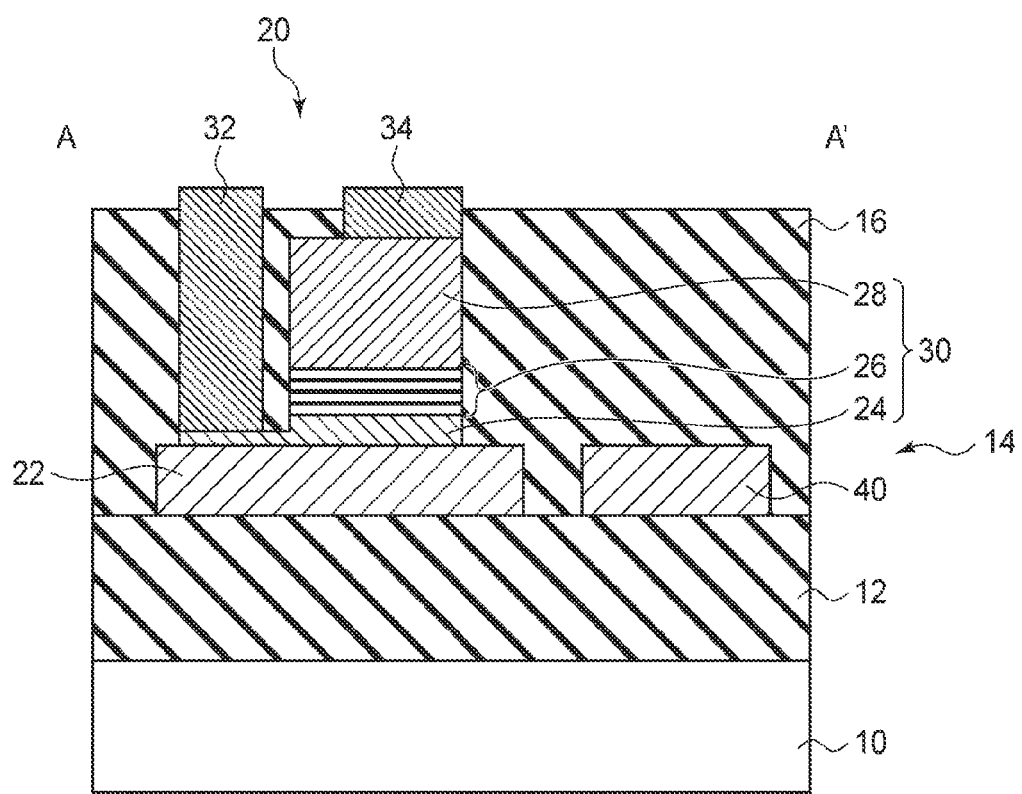
FIG. 2 is a schematic sectional view depicting a structure of the optical semiconductor device according to the first embodiment.
Figure 3:
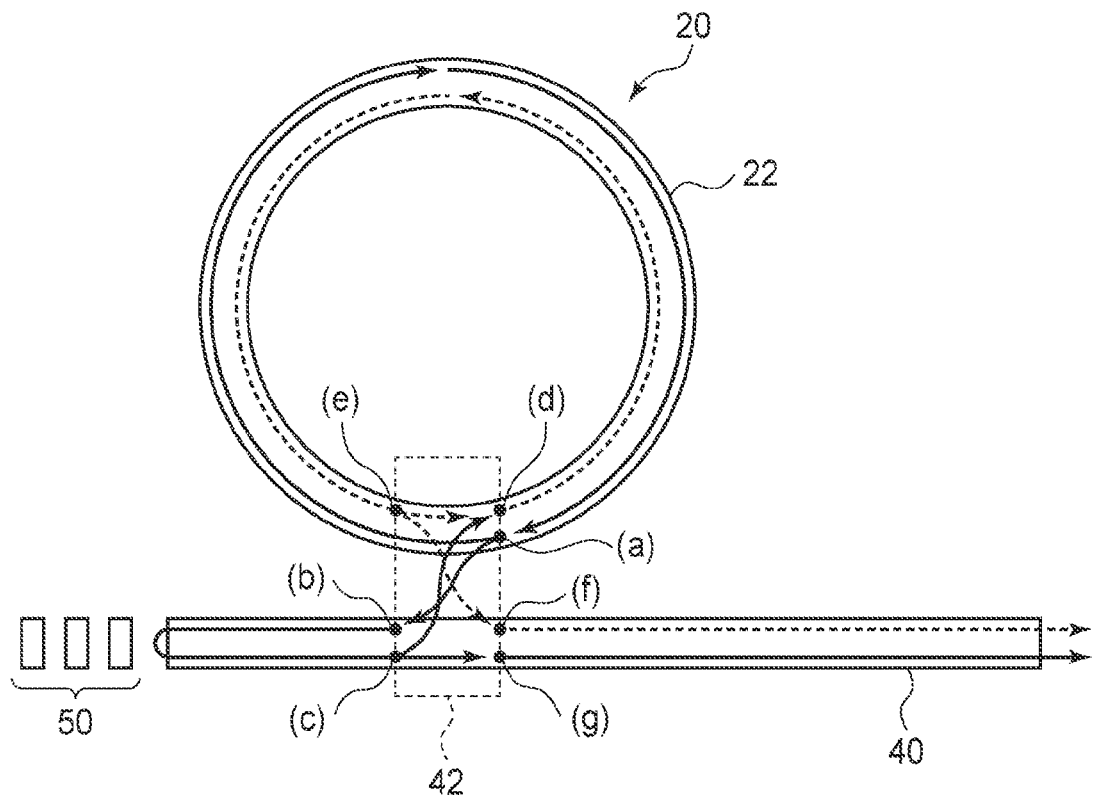
FIG. 3 is a view illustrating operation of the optical semiconductor device according to the first embodiment.

FIG. 1 is a top plan view depicting a structure of the optical semiconductor device according to the present embodiment. FIG. 2 is a schematic sectional view depicting the structure of the optical semiconductor device according to the present embodiment. FIG. 3 is a view illustrating operation of the optical semiconductor device according to the present embodiment. FIGS. 4 to 10 are top plan views depicting a structure of optical semiconductor devices according to modifications to the present embodiment.

First, a structure of the optical semiconductor device according to the present embodiment is described with reference to FIGS. 1 and 2. FIG. 2 is a sectional view taken along line A-A' of FIG. 1.

As depicted in FIG. 1, the optical semiconductor device according to the present embodiment includes a ring laser 20 formed from a ring resonator, a linear waveguide 40 optically coupled to the ring laser 20, and a reflector 50 provided at an end portion of the linear waveguide 40. The ring laser 20 and the linear waveguide 40 are coupled to each other by a 2×2 optical coupler 42.

The optical waveguide structure depicted in FIG. 1 can be formed using an SOI (Silicon On Insulator) substrate, for example, as depicted in FIG. 2. The SOI substrate includes a silicon substrate 10, a silicon oxide film 12 as a buried insulating layer formed on the silicon substrate 10, and a silicon layer 14 formed on the silicon oxide film 12. In the optical waveguide structure employing the SOI substrate, a core can be formed from silicon and a cladding can be formed from a silicon oxide film.

The ring laser 20 includes a ring waveguide 22 formed by patterning the silicon film 14, and an optical gain medium layer (optical gain element) 30 formed on the ring waveguide 22. An optical gain medium is a material having a function for amplifying light. As the optical gain medium layer 30, for example, an active layer structure of a semiconductor optical amplifier can be applied.

As an example of the optical gain medium layer 30, for example, a structure body formed by sandwiching and retaining an MQW (Multiple Quantum Well) layer 26 between and by a P-type InGaAsP layer 24 and an N-type InGaAsP layer 28 as depicted in FIG. 2 is available. In this case, a pair of electrodes 32 and 34 for applying a voltage to the optical gain medium layer 30 to inject current are provided on the P-type InGaAsP layer 24 and the N-type InGaAsP layer 28, respectively.

The optical gain medium layer 30 can be formed, for example, by forming a layer on an InP substrate by epitaxial growth, separating the layer from the InP substrate, bonding the layer on the ring waveguide by physical coupling employing intermolecular force or chemical coupling employing polymer, and processing the layer into a desire shape.

The linear waveguide 40 and the reflector 50 can be formed, for example, by patterning the silicon layer 14 of the SOI substrate.

The reflector 50 is, for example, such a distribution Bragg reflector as depicted in FIG. 1. If a periodical structure is formed from a silicon film and a silicon oxide film having refractive indexes different from each other and is designed such that the optical length in the silicon and silicon oxide films is, for example, $\lambda/4$, then the reflector 50 that reflects light having a wavelength $\lambda$ is obtained. By suitably increasing or decreasing the repetition number of times of the periodical structure, the reflectance can be adjusted.

A silicon oxide layer 16 as a cladding is formed on the ring laser 20, linear waveguide 40 and reflector 50.

Now, operation of the optical semiconductor device according to the present embodiment is described with reference to FIG. 3.

If a voltage is applied between the electrodes 32 and 34 of the ring laser 20, then current is injected to the optical gain medium layer 30 and an optical gain occurs in the MQW layer 26. Since a laser employing a ring resonator can oscillate generally in both of a clockwise (CW) mode and a counterclockwise (CCW) mode, light (CW mode light) to propagate in the clockwise direction and light (CCW mode light) to propagate in the counterclockwise direction are oscillated in the ring waveguide 22. The wavelength of the light oscillated in the ring waveguide 22 satisfies a resonance condition in accordance with a circumferential optical path length of the ring waveguide 22.

The CW mode light oscillated in the ring waveguide 22 is guided to the linear waveguide 40 through the optical coupler 42 and is reflected by the reflector 50 and then is outputted from an output port (on the right side in FIG. 3) of the linear waveguide 40.

Part of the light reflected by the reflector 50 is guided to the ring waveguide 22 through the optical coupler 42 and causes induced emission (stimulated emission) of CCW mode light. The CCW mode light induced (stimulated) in the ring waveguide 22 in this manner is oscillated compulsorily using the CW mode light returning from the reflector 50 as a seed, and the phase relationship between the CW mode light and the CCW mode light is defined by the phase of the CW mode light returning from the reflector 50.

The CCW mode light induced (stimulated) in the ring waveguide 22 is guided to the linear waveguide 40 through the optical coupler 42 and is outputted from the output port of the linear waveguide 40.

It is to be noted that, while the CCW light in the example described above is oscillated compulsorily using the CW mode light as a seed, for example, the reflector 50 may be provided at an end portion of the opposite side of the linear waveguide 40 such that CW mode light is oscillated compulsorily using the CCW mode light as a seed.

Now, phases at various points of the device are described successively with reference to FIG. 3.

A phase variation of the optical coupler 42 upon propagation in a cross direction is defined as $\alpha$ and a phase variation of the optical coupler 42 upon propagation in a bar direction is defined as $\beta$. Where the phase of the CW mode light at a point (a) is determined as 0, the phase of light propagating in the optical coupler 42 in the cross direction to a point (b) is $\alpha$. Where the phase variation when light propagates in the leftward direction in the linear waveguide 40 from the point (b) and is reflected by the reflector 50 and then propagates to a point (c) is determined as $\phi$, the phase at the point (c) is $\alpha+\phi$.

The light propagated to the point (c) is divided into a component that is to propagate in the cross direction in the optical coupler 42 and return to the ring waveguide 22 and another component that is to propagate in the bar direction in the optical coupler 42 and linearly advance in the linear waveguide 40. At this time, the phase of the component returning to the ring waveguide 22 at a point (d) is $2\alpha+\phi$. Further, the phase of the component linearly advancing in the linear waveguide 40 at a point (g) is $\alpha+\phi+\beta$.

Since the phase variation when light goes round the ring waveguide 22 is $2m\pi$ from a resonance condition where m is an integer, the phase at a point (e) is $2\alpha+\phi+2\ m\pi-\beta$ that represents that the phase variation amount is smaller by $\beta$ than $2\ m\pi$. Accordingly, the phase at a point (f) when the CCW mode light is outputted from the ring waveguide 22 is $3\alpha+\phi+2\ m\pi-\beta$.

From the foregoing, the phase difference between the phase at the point (f) of the CCW mode light outputted from the ring waveguide 22 and the phase at the point (g) of the CW mode light outputted from the ring waveguide 22 and reflected by the reflector 50 is $2(\alpha-\beta+m\pi)$. Since the difference between $\alpha$ and $\beta$ is $\pi$ in the 2×2 optical coupler 42, it is recognized that the light described above satisfies a constructive interference condition.

In particular, the CW mode light and CCW mode light outputted from the ring laser 20 are collected to one port, and constructive interference occurs irrespective of the phase variation amount $\phi$ when the light returns from the reflector 50. Consequently, the output power can be increased to twice (refer to first and fourth reference examples hereinafter described) in comparison with an alternative case in which only one of the CW mode light and the CCW mode light is outputted.

Further, the seed light source for selectively oscillating one of the CW mode light and the CCW mode light is not required (refer to a second reference example hereinafter described). Consequently, the size of the device can be reduced and the power consumption can be decreased. Further, the fabrication cost can be decreased.

Further, the waveguide structure for selectively oscillating one of the CW mode light and the CCW mode light need not be made non-symmetrical (refer to a third reference example hereinafter described). Consequently, waveguide loss by this can be prevented.

Figure 4:
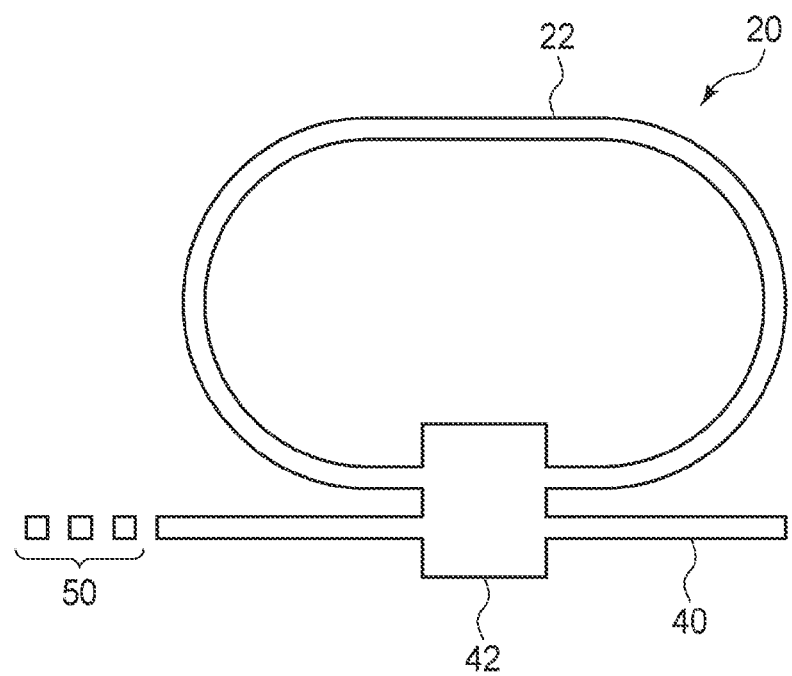
FIG. 4 is a top plan view (part 1) depicting a structure of an optical semiconductor device according to a modification to the first embodiment.
Figure 5:
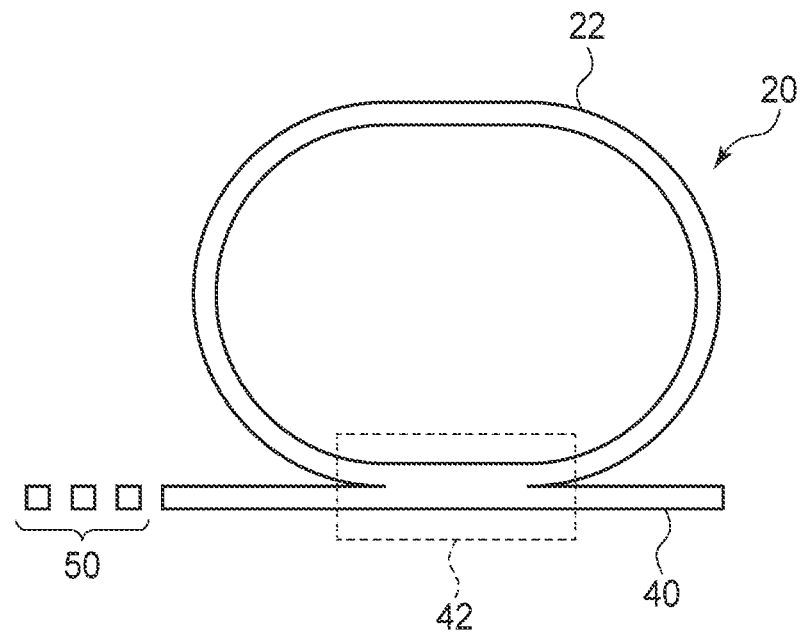
FIG. 5 is a top plan view (part 2) depicting a structure of an optical semiconductor device according to a modification to the first embodiment.
Figure 6:
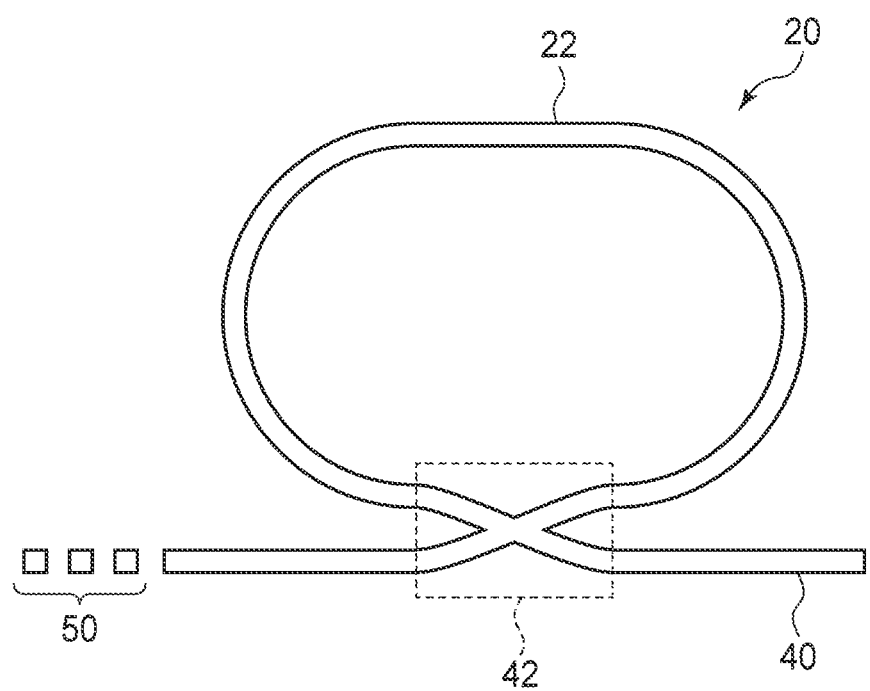
FIG. 6 is a top plan view (part 3) depicting a structure of an optical semiconductor device according to a modification to the first embodiment.
Figure 7:
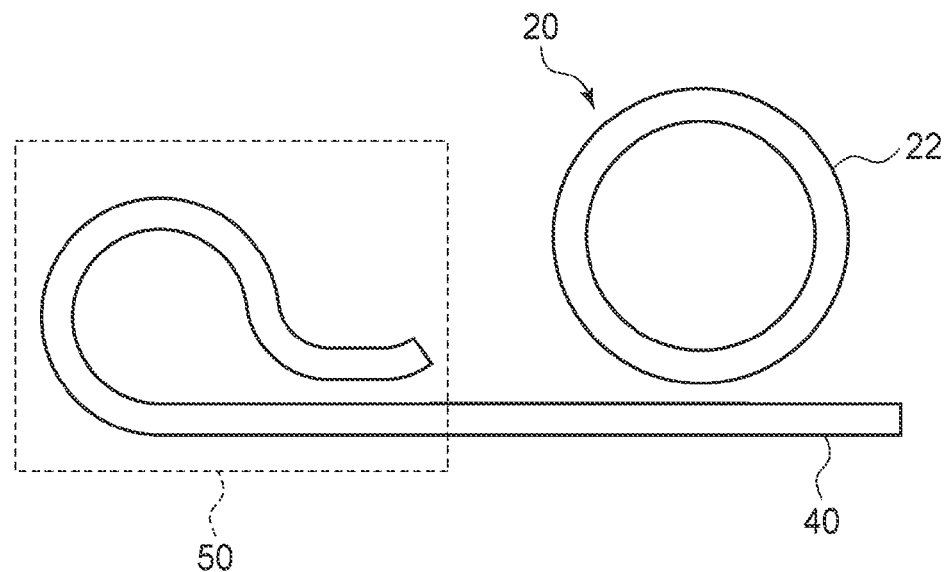
FIG. 7 is a top plan view (part 4) depicting a structure of an optical semiconductor device according to a modification to the first embodiment.
Figure 8:
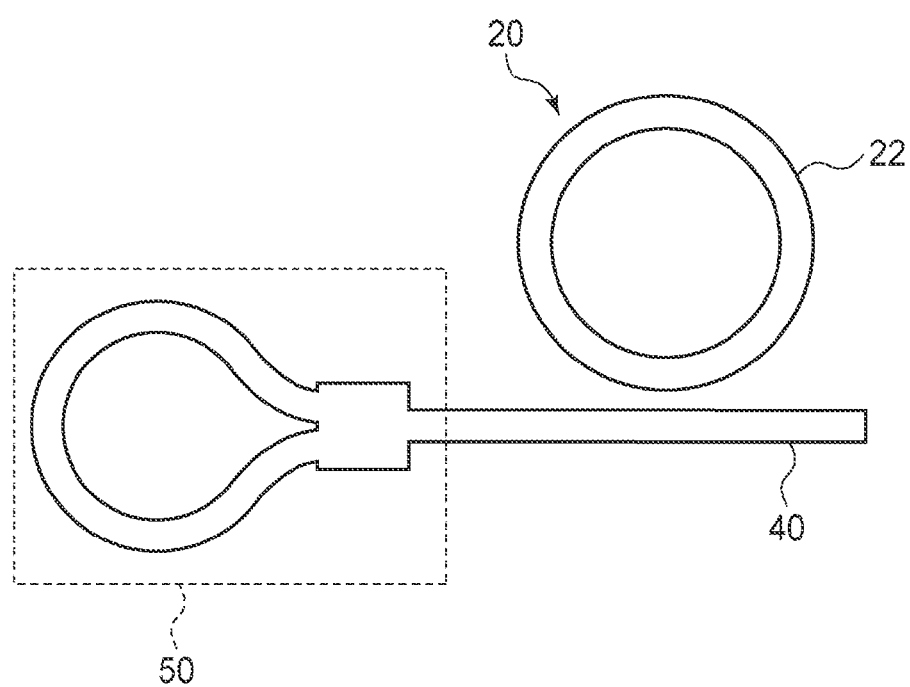
FIG. 8 is a top plan view (part 5) depicting a structure of an optical semiconductor device according to a modification to the first embodiment.
Figure 9:
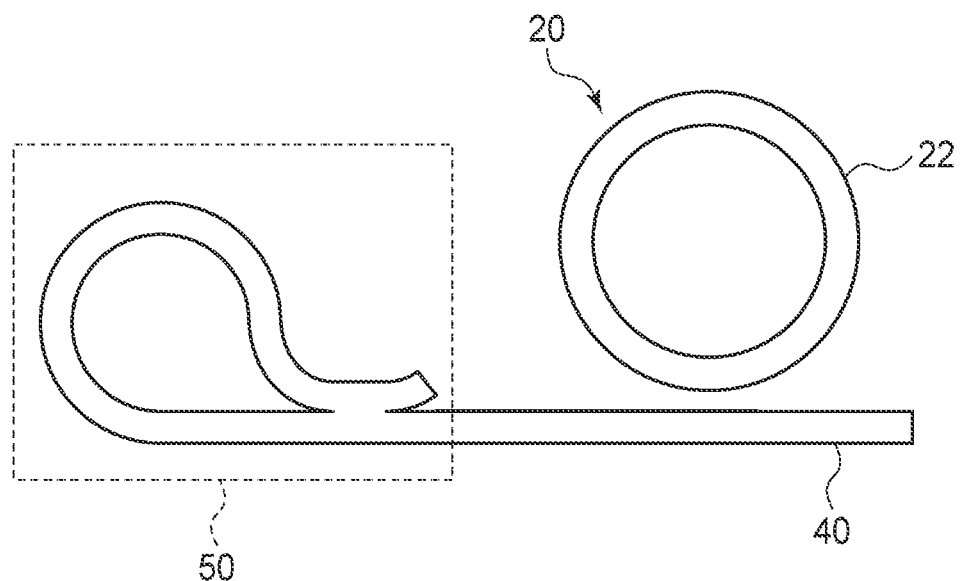
FIG. 9 is a top plan view (part 6) depicting a structure of an optical semiconductor device according to a modification to the first embodiment.
Figure 10:
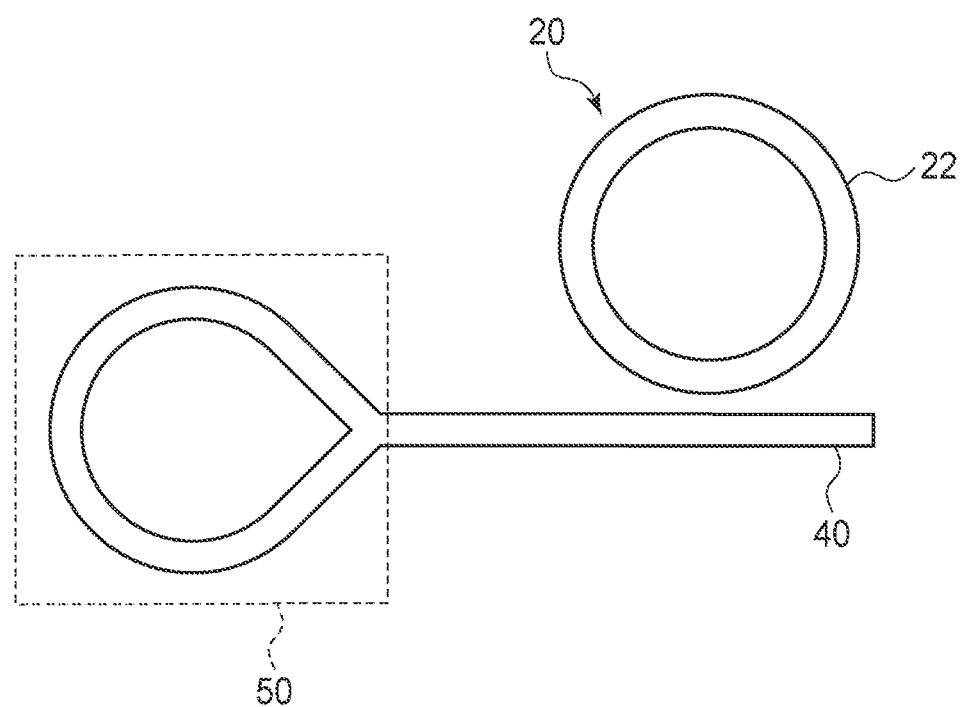
FIG. 10 is a top plan view (part 7) depicting a structure of an optical semiconductor device according to a modification to the first embodiment.

The optical coupler 42 is not limited to such a directional coupler as depicted in FIG. 1, and various 2×2 couplers can be applied. For example, such an MMI (Multimode Interferometer) coupler as depicted in FIG. 4, such a TMI (2-Mode Interferometer) coupler as depicted in FIG. 5 and such an X coupler as depicted in FIG. 6 are applicable. The MMI coupler is advantageous in that the tolerance for processing accuracy is great although the degree of freedom of the branching ratio is limited. The MMI coupler is effective particularly for a case in which a silicon wire waveguide having a great characteristic variation with respect to a size variation is employed. The TMI coupler has a freedom in branching ratio and besides has no gap between two waveguides as in the case of a directional coupler. Therefore, the characteristic variation by the processing accuracy can be reduced.

Further, the reflector 50 is not limited to such a distribution Bragg reflector as depicted in FIG. 1, and various reflectors can be applied. FIGS. 7 to 10 are views depicting examples in which a loop mirror is employed as the reflector 50. In the reflector 50 depicted in FIG. 7, a directional coupler is used as a branching element (branching filter; demultiplexer) configuring the loop mirror. In the reflector 50 depicted in FIG. 8, an MMI coupler is used as a branching element configuring the loop mirror. In the reflector 50 depicted in FIG. 9, a TMI coupler is used as a branching element configuring the loop mirror. In the reflector 50 depicted in FIG. 10, a Y-branch branching element is used as a branching element configuring the loop mirror.

In this manner, with the present embodiment, since the reflector is provided at one end portion of the waveguide coupled to the ring laser such that the CW mode light and the CCW mode light oscillated by the ring laser constructively interfere with each other, the output power can be increased significantly in comparison with that in a case in which one mode is outputted. Further, since only the reflector is provided at one end portion of the waveguide and a special function for selectively oscillating one mode, namely, a special function for providing a mode selection performance, need not be provided, increase of the device size and increase of the power consumption can be suppressed.

Second Embodiment

Figure 12:
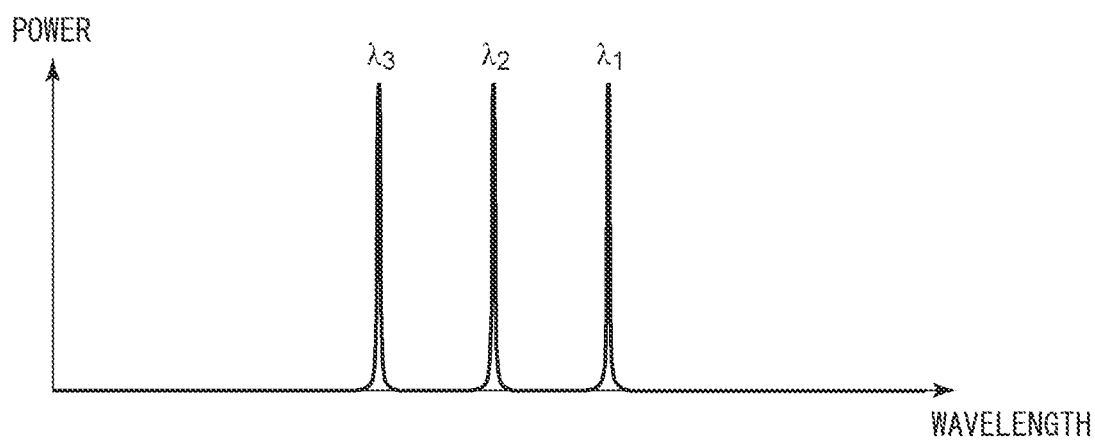
FIG. 12 is a graph illustrating an example of a light emission spectrum of the optical semiconductor device according to the second embodiment.
Figure 13:
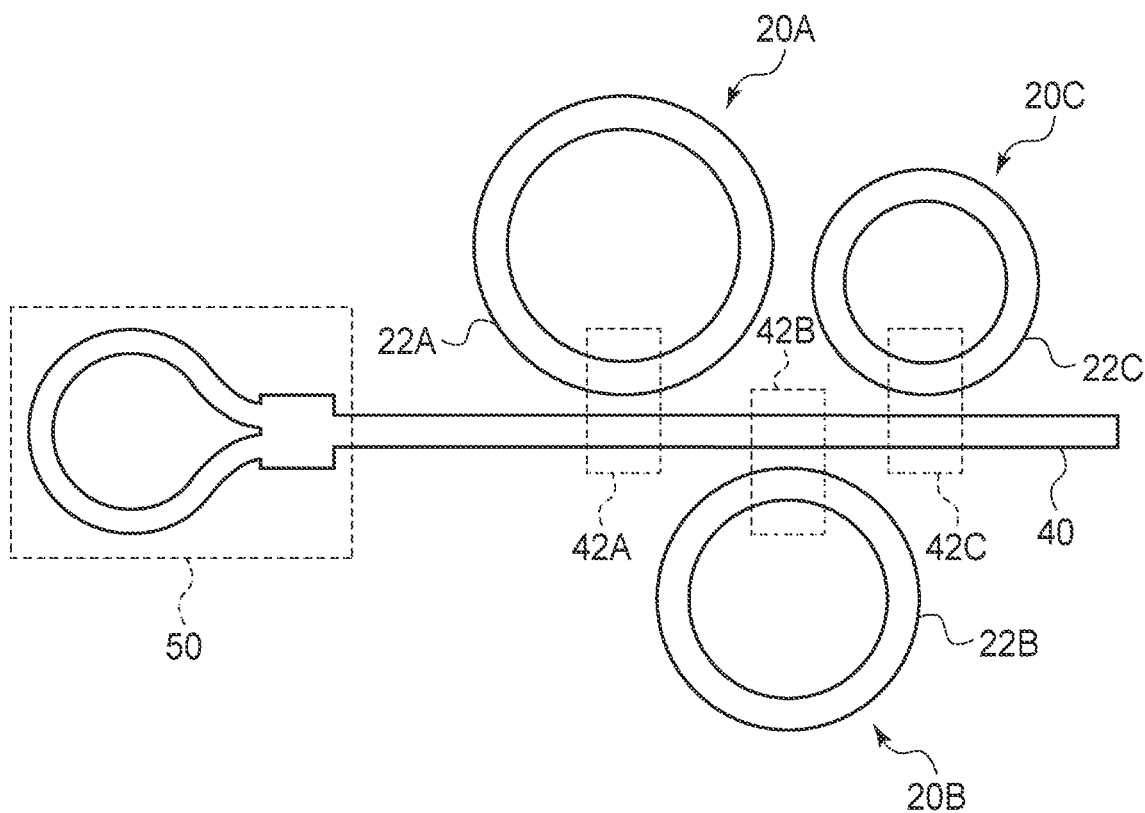
FIG. 13 is a top plan view depicting a structure of an optical semiconductor device according to a modification to the second embodiment.

An optical semiconductor device according to a second embodiment is described with reference to FIGS. 11 to 13. Like elements to those of the optical semiconductor device according to the first embodiment depicted in FIGS. 1 to 10 are denoted by like reference characters, and description of them is omitted or simplified.

Figure 11:
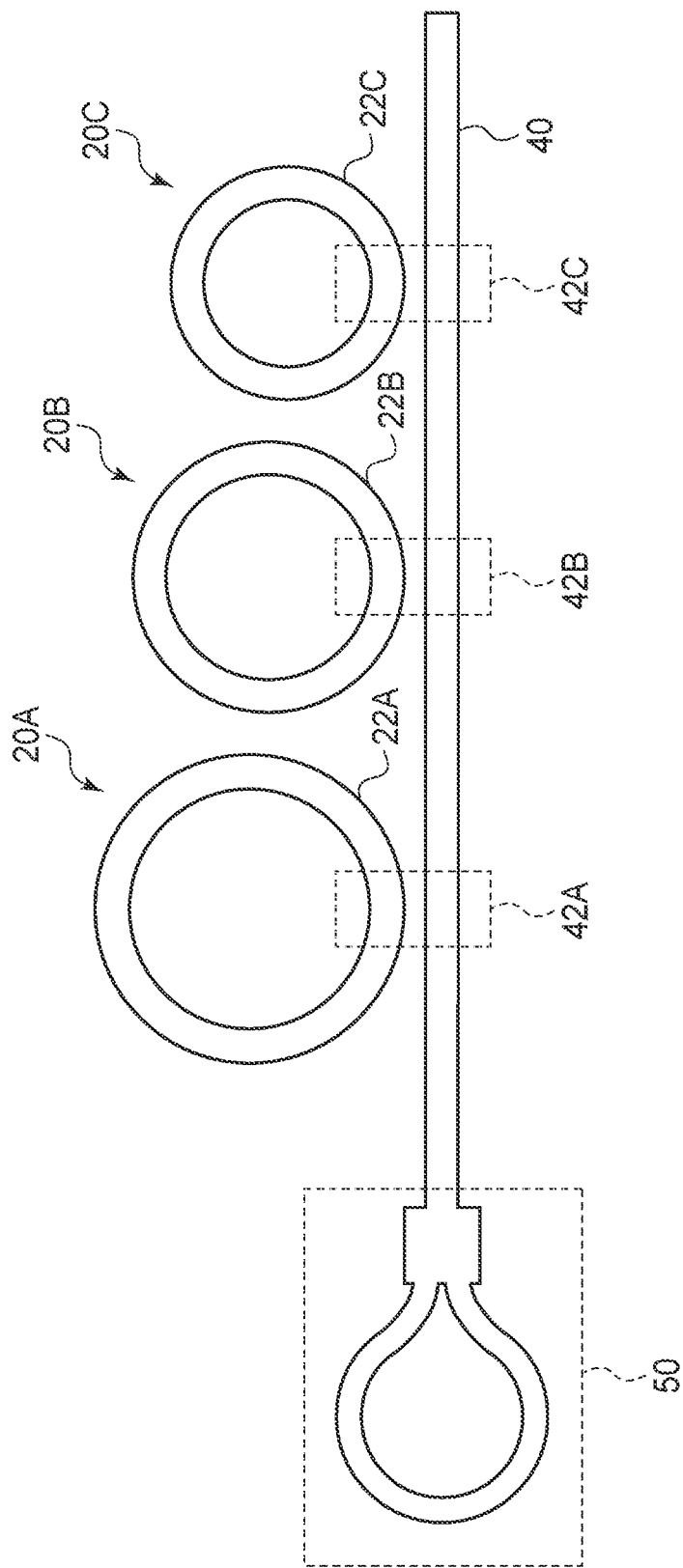
FIG. 11 is a top plan view depicting a structure of an optical semiconductor device according to a second embodiment.

FIG. 11 is a top plan view depicting a structure of the optical semiconductor device according to the present embodiment. FIG. 12 is a graph illustrating an example of a light emission spectrum of the optical semiconductor device according to the present embodiment. FIG. 13 is a top plan view depicting a structure of an optical semiconductor device according to a modification to the present embodiment.

The optical semiconductor device according to the present embodiment is similar to that of the optical semiconductor device according to the first embodiment depicted in FIG. 1 except that it is different in number of ring lasers 20 as depicted in FIG. 11. In particular, in the optical semiconductor device according to the present embodiment, three ring lasers 20A, 20B and 20C individually configured from a ring resonator are provided. Ring waveguides 22A, 22B and 22C of the ring lasers 20A, 20B and 20C are different in circumferential optical path length, namely, in resonance wavelength, from each other. The ring waveguides 22A, 22B and 22C of the ring lasers 20A, 20B and 20C are coupled to the linear waveguide 40 through 2×2 optical couplers 42A, 42B and 42C, respectively. A reflector 50 is provided at one end portion of the linear waveguide 40.

As described in connection with the first embodiment, by providing the reflector 50 at one end portion of the linear waveguide 40, CW mode light and CCW mode light oscillated from the ring laser 20 can be outputted from an output port while they constructively interfere with each other. Such operation as just described similarly applies also to a case in which a plurality of ring lasers 20A, 20B and 20C are provided so as to couple to the linear waveguide 40.

By making the resonance wavelengths of the ring waveguides 22A, 22B and 22C different from each other, a multi-wavelength light source that oscillates light having wavelengths different from each other can be obtained. For example, as depicted in FIG. 12, a multi-wavelength light source having oscillation wavelengths at wavelengths $\lambda 1$, $\lambda 2$ and $\lambda 3$ can be obtained corresponding to the resonance wavelengths of the ring waveguides 22A, 22B and 22C. Also in this case, since the CW mode light and the CCW mode light are collected into a single light, the power obtained from the ring lasers 20A, 20B and 20C can be doubled.

Constructive interference between the CW mode light and the CCW mode light is not influenced by the phase variation amount $\phi$ when they reciprocate between the optical coupler 42 and the reflector 50 as described above. Accordingly, the place at which the ring lasers 20A, 20B and 20C are coupled to the linear waveguide 40 is not limited specifically. Consequently, the degree of freedom in disposition of the ring lasers 20A, 20B and 20C can be improved significantly. For example, by disposing the ring lasers 20A, 20B and 20C on opposite sides of the linear waveguide 40 as depicted in FIG. 13, a bus waveguide (linear waveguide 40) can be configured short and the device area can be reduced significantly.

In this manner, with the present embodiment, since the reflector is provided at one end portion of the waveguide coupled to the ring lasers and CW mode light and CCW mode light oscillated by the ring lasers constructively interfere with each other, the output power can be increased significantly in comparison with that in an alternative case in which one mode is outputted. Further, since only it is necessary to provide the reflector at one end portion of the waveguide and a special function for selectively oscillating one mode, namely, a special function for providing a mode selection performance, need not be provided, increase of the device size and increase of the power consumption can be suppressed. Further, by providing a plurality of ring lasers with respect to a single waveguide, a multi-wavelength light source of optical outputs can be implemented.

MODIFICATION

The present invention is not limited to the embodiments described above, and various modifications can be made.

For example, while, in the embodiments described above, silicon is used as the core material and a silicon oxide film is used as the cladding material, the core material and the cladding material are not limited to them. For example, a compound semiconductor may be used as the core material.

Further, while, in the embodiments described above, the optical gain medium layer 30 is provided on the ring waveguide 22, the optical gain medium is not necessarily provided on the ring waveguide 22. For example, part of the ring waveguide 22 may be cut such that a chip of a semiconductor optical amplifier formed from a compound semiconductor is flip-chip mounted at the cut location.

For example, the ring waveguide 22 and the linear waveguide 40 in the embodiments described above may be configured from a waveguide having a rib structure wherein a silicon rib is formed on a silicon slab.

Further, while, in the embodiments described above, the distribution Bragg reflector is formed from a portion at which the silicon core is provided and another portion at which the silicon core is not provided, it may otherwise be formed in a structure wherein part of the silicon core is configured from a silicon oxide film or another structure wherein the thickness of the slab portion of the rib waveguide is varied.

Further, while, in the second embodiment described above, the three ring lasers 20A, 20B and 20C are provided, the number of ring lasers is not limited to three. The number of ring lasers 20 may be set to two, four or more.

Further, while, in the embodiments described above, the planar shape of the ring waveguides 22, 22A, 22B and 22C of the ring laser 20, 20A, 20B and 20C is set to a true circular shape, this is not limited to the true circular shape if a ringed waveguide shape is applied. Further, the waveguide coupled to the ring laser is not necessarily configured as a linear waveguide.

Further, the structure, configuration material and so forth of the optical semiconductor devices according to the embodiments described above are a mere example and can be suitably modified or changed in accordance with a technical common sense or the like of a person skilled in the art.

First Reference Example

An optical semiconductor device according to a first reference example is described with reference to FIG. 14.

Figure 14:
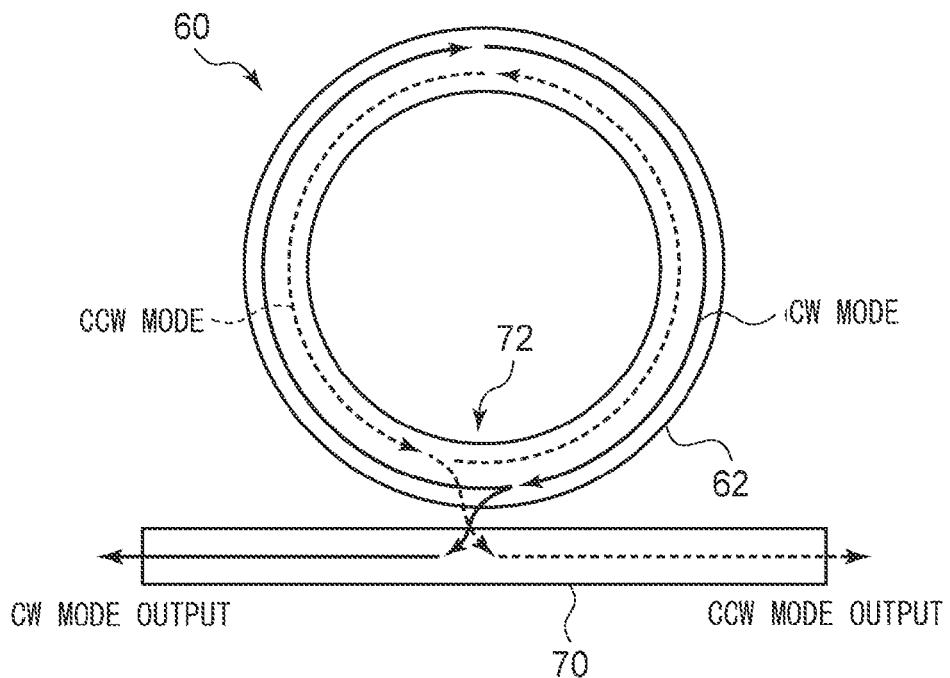
FIG. 14 is a top plan view depicting a structure of an optical semiconductor device according to a first reference example.

FIG. 14 is a top plan view depicting a structure of the optical semiconductor device according to the present reference example.

The optical semiconductor device according to the present reference example includes a ring laser 60 having a ring waveguide 62 and a linear waveguide 70 optically coupled to the ring laser 60.

Since the laser employing a ring resonator can oscillate generally in both of a clockwise mode and a counterclockwise mode, light (CW mode light) propagating in a clockwise direction and light (CCW mode light) propagating in a counterclockwise direction are oscillated in the ring waveguide 22.

In this case, from within the light oscillated in the ring waveguide 22, the CW mode light propagates to the left side of the linear waveguide 70 through an optical coupler 72 while the CCW mode light propagates to the right side of the linear waveguide 70 through the optical coupler 72.

Accordingly, with the optical semiconductor device according to the present reference example, since the CW mode light and the CCW mode light are outputted from ports different from each other, the power per one port is reduced by one half with respect to the oscillation power of the ring laser 60.

Second Reference Example

An optical semiconductor device according to a second reference example is described with reference to FIG. 15.

Figure 15:
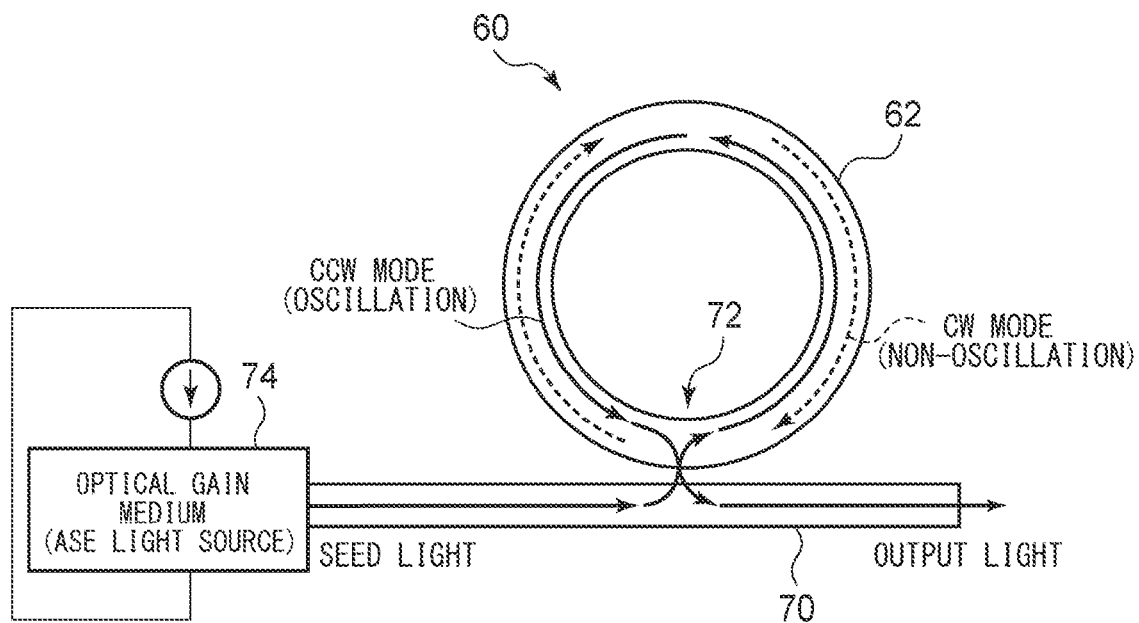
FIG. 15 is a top plan view depicting a structure of an optical semiconductor device according to a second reference example.

FIG. 15 is a top plan view depicting a structure of the optical semiconductor device according to the present reference example.

In the optical semiconductor device according to the present reference example, an ASE (Amplified Spontaneous Emission) light source 74 is provided at one end portion of the linear waveguide 70 of the optical semiconductor device according to the first reference example.

Light oscillated from the ASE light source 74 is introduced from one end portion of the linear waveguide 70 into the ring waveguide 62 through the optical coupler 72. Consequently, CCW mode light can be selectively oscillated using light from the ASE light source 74 as seed light. Consequently, the output power per one port can be improved.

However, since the ASE light source is required for the optical semiconductor device according to the present reference example, the device size increases and also the power consumption increases. Also the fabrication cost increases.

Third Reference Example

An optical semiconductor device according to a third reference example is described with reference to FIG. 16.

Figure 16:
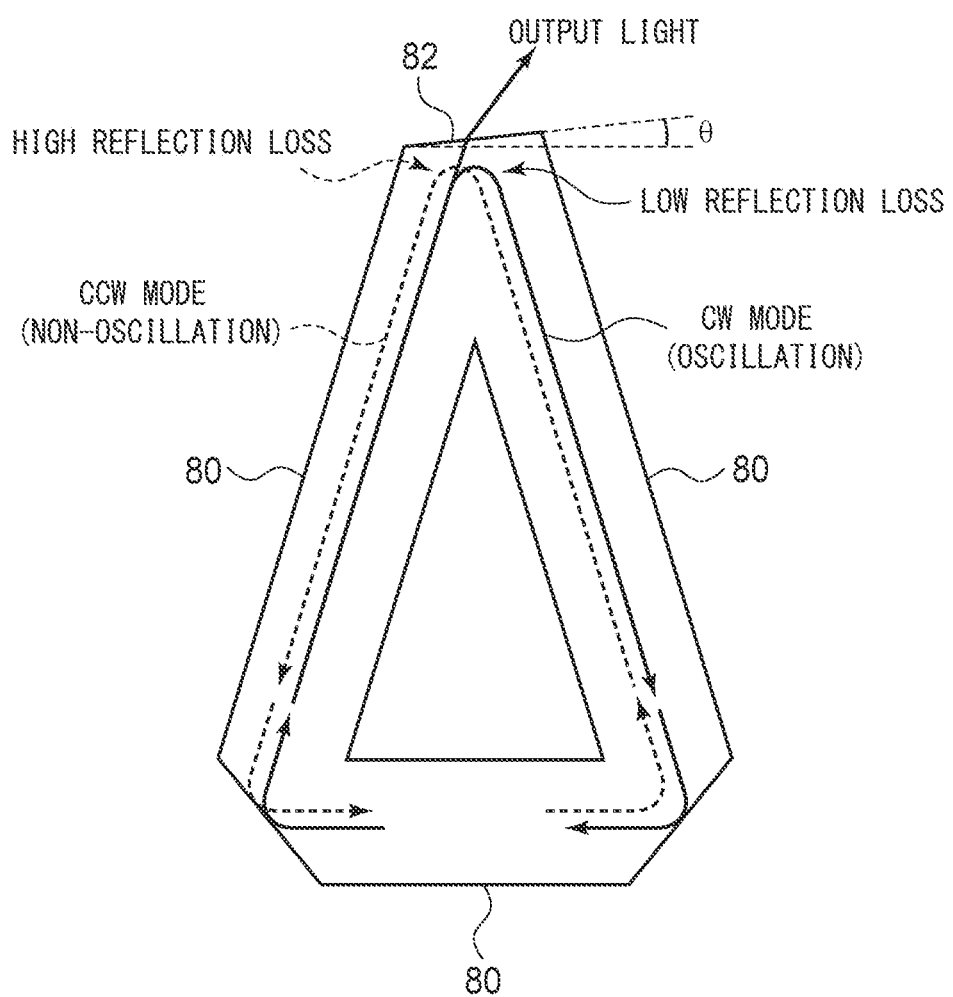
FIG. 16 is a top plan view depicting a structure of an optical semiconductor device according to a third reference example.

FIG. 16 is a top plan view depicting a structure of the optical semiconductor device according to the present reference example.

In the optical semiconductor device according to the present reference example, a plurality of linear waveguides 80 are combined and reflection of light by a waveguide end face is utilized to form a ring resonator. The angle of one waveguide end face (upper waveguide end face 82 in FIG. 16) is configured in a non-symmetrical relationship with respect to left and right waveguides 80 so that the reflectivity of CW mode light and the reflectivity of CCW mode light by the waveguide end face 82 are made different from each other. Consequently, one mode can be selectively oscillated.

However, since, in the optical semiconductor device according to the present reference example, the waveguide is configured in a non-symmetrical relationship, the light is reflected in a direction displaced from the waveguide direction. Therefore, waveguide loss cannot be avoided and the energy efficiency degrades.

Fourth Reference Example

An optical semiconductor device according to a fourth reference example is described with reference to FIGS. 17 and 18A to 18C.

Figure 17:
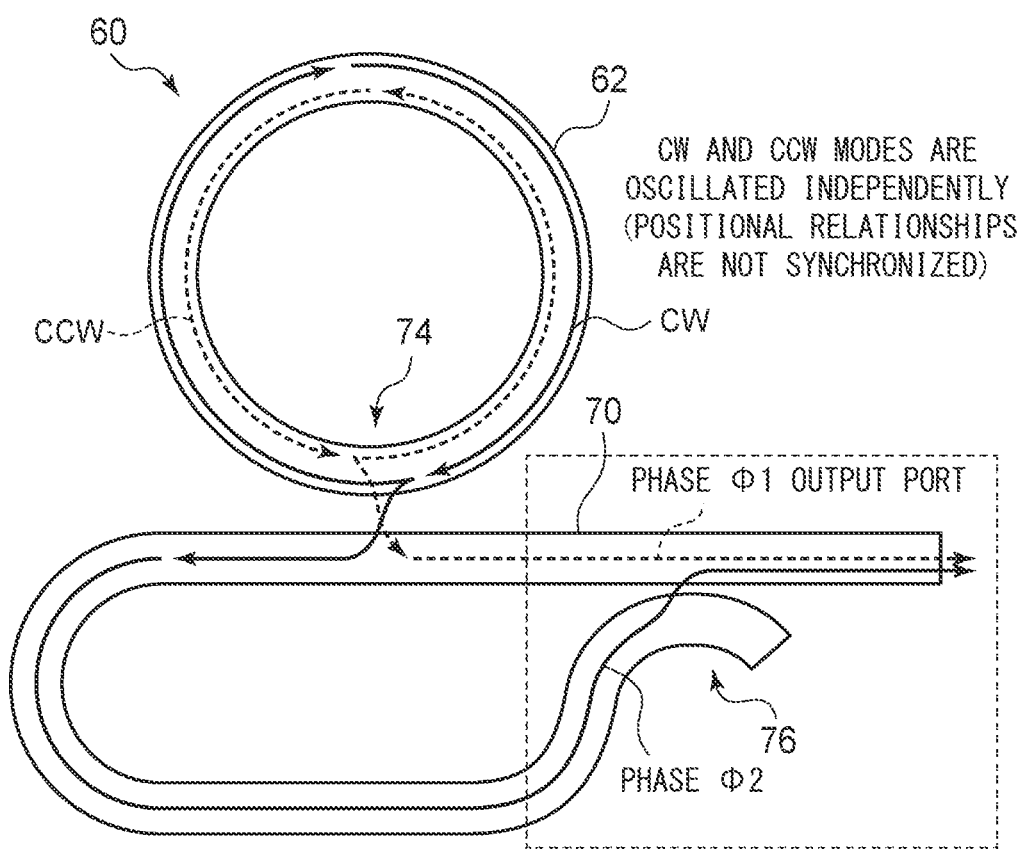
FIG. 17 is a top plan view depicting a structure of an optical semiconductor device according to a fourth reference example.
Figure 18A:
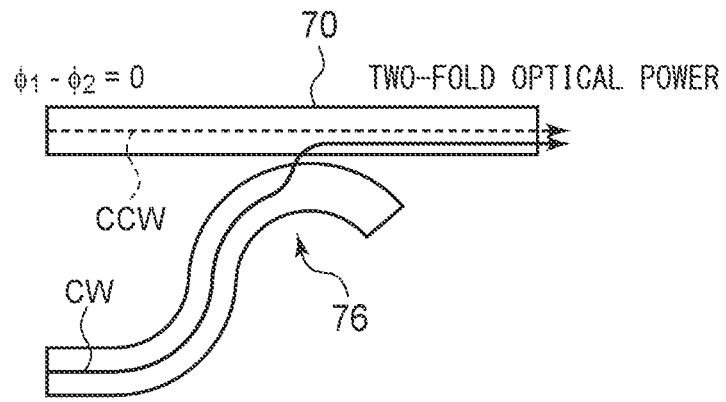
FIGS. 18A to 18C are views illustrating operation of the optical semiconductor device according to the fourth reference example.
Figure 18B:
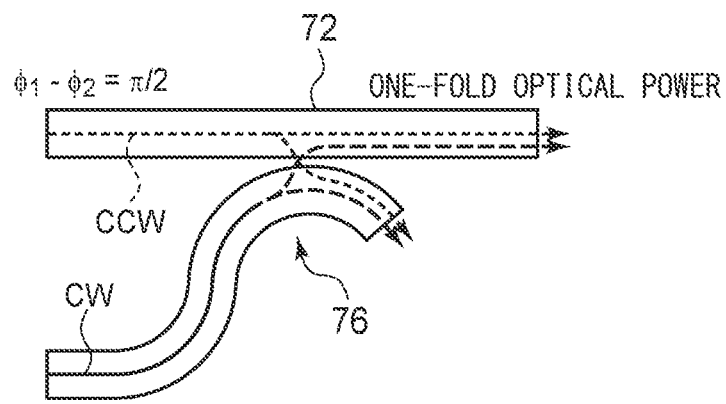
Figure 18C:
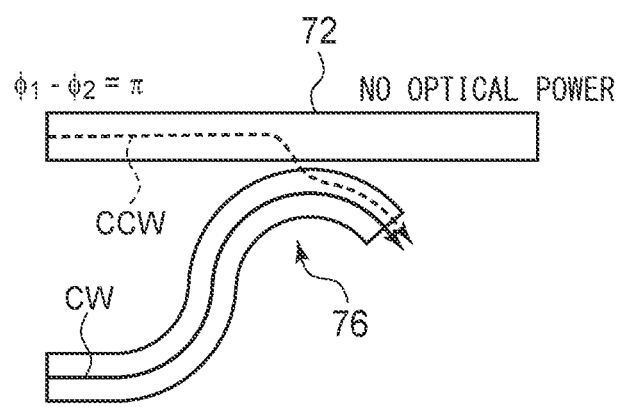

FIG. 17 is a top plan view depicting a structure of the optical semiconductor device according to the present reference example. FIGS. 18A to 18C are views illustrating operation of the optical semiconductor device according to the present reference example.

In the optical semiconductor device according to the present reference example, oscillation light outputted from the two output ports of the optical semiconductor device according to the first reference example are multiplexed employing a multiplexer 76 such as a directional coupler or a Y-branch, and the resulting light is outputted from one output port.

However, in the optical semiconductor device according to the present reference example, the output power varies depending upon the phase difference between the CW mode light and the CCW mode light.

Where the phase of the CW mode light before incidence to the multiplexer 76 is defined as $\phi 1$ and the phase of the CCW mode light before incidence to the multiplexer 76 is defined as $\phi 2$, when $\phi 1 - \phi 2 = 0$, the power of both modes is guided to the output port and the output power becomes twice from that of one mode (refer to FIG. 18A).

However, when $\phi 1 - \phi 2 = \pi/2$, only one half of the power of both modes is outputted to the output port (refer to FIG. 18B). Further, when $\phi 1 - \phi 2 = \pi$, the output power to be guided to the output port is 0 (refer to FIG. 18C).

The CW mode light and the CCW mode light oscillate independently of each other and the phase relationship is not defined and varies with respect to time. Accordingly, in the optical semiconductor device according to the present reference example, the output power does not necessarily become twice and varies.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A monolithic optical semiconductor device, comprising:
   a ring laser having a ring resonator structure, the ring laser including a ring shaped waveguide and an optical gain element, the optical gain element being provided at least partially along a circumferential direction of the ring shaped waveguide and having an optical gain by current injection electrodes;
   a waveguide optically coupled to the ring laser;
   a reflector provided at an end portion of the waveguide; and
   a Silicon on Insulator (SOI) film on a substrate on which the waveguide and ring laser are mounted, wherein the waveguide and ring laser formed adjacent to each other; and
   a cladding is formed on the waveguide, the ring laser and the reflector.

2. The optical semiconductor device according to claim 1, further comprising a plurality of the ring lasers optically coupled to the waveguide.

3. The optical semiconductor device according to claim 2, wherein the plurality of the ring lasers have oscillation wavelengths different from each other.

4. The optical semiconductor device according to claim 1, wherein the ring laser and the waveguide are optically coupled to each other by a directional coupler.

5. The optical semiconductor device according to claim 1, wherein the ring laser and the waveguide are optically coupled to each other by a multimode interference optical coupler.

6. The optical semiconductor device according to claim 1, wherein the ring laser and the waveguide are optically coupled to each other by a two-mode interference optical coupler.

7. The optical semiconductor device according to claim 1, wherein the reflector is a distributed Bragg reflector.

8. The optical semiconductor device according to claim 1, wherein the reflector is a loop mirror including a branching element coupled to the waveguide and a loop waveguide coupled to the branching element.

9. The optical semiconductor device according to claim 8, wherein the branching element is a directional coupler.

10. The optical semiconductor device according to claim 8, wherein the branching element is a multimode interference optical coupler.

11. The optical semiconductor device according to claim 8, wherein the branching element is a Y-branch branching element.

12. The optical semiconductor device according to claim 1, wherein a core material of the ring resonator and the waveguide is silicon.

13. The optical semiconductor device according to claim 12, wherein the optical gain element is formed from a compound semiconductor layer bonded to the ring resonator.

14. The optical semiconductor device according to claim 1, wherein the ring laser oscillates in a clockwise (CW) mode and a counterclockwise (CCW) mode.

* * * * *